United States Patent [19]

Horwath et al.

[11] Patent Number: 4,830,706
[45] Date of Patent: May 16, 1989

[54] METHOD OF MAKING SLOPED VIAS

[75] Inventors: Ronald S. Horwath, Binghamton; John R. Susko; Robin A. Susko, both of Owega, all of N.Y.

[73] Assignee: International Business Machines Corporation, Armonk, N.Y.

[21] Appl. No.: 915,462

[22] Filed: Oct. 6, 1986

[51] Int. Cl.$^4$ .............................................. B44C 1/22
[52] U.S. Cl. .................................. 156/643; 156/644; 156/652; 156/656; 156/659.1; 156/661.1
[58] Field of Search ............... 156/643, 644, 652, 656, 156/661.1, 659.1, 658, 904, 85; 430/315

[56] References Cited

U.S. PATENT DOCUMENTS

| | | | |
|---|---|---|---|
| 4,328,262 | 5/1982 | Kurahashi et al. | 427/93 |
| 4,328,263 | 5/1982 | Kurahashi et al. | 427/93 |
| 4,353,778 | 10/1982 | Fineman et al. | 156/644 |
| 4,482,427 | 11/1984 | Hiraoka | 156/644 X |
| 4,495,220 | 1/1985 | Wolf et al. | 156/644 X |
| 4,545,851 | 10/1985 | Takada | 156/345 X |
| 4,590,258 | 5/1986 | Linde et al. | 528/189 |
| 4,601,915 | 7/1986 | Allen et al. | 430/315 X |
| 4,661,204 | 4/1987 | Mathur et al. | 156/644 X |
| 4,670,297 | 6/1987 | Lee et al. | 427/91 |

FOREIGN PATENT DOCUMENTS

| | | |
|---|---|---|
| 0025261 | 3/1981 | European Pat. Off. |
| 0026967 | 4/1981 | European Pat. Off. |
| 0154720 | 9/1985 | European Pat. Off. |
| 0216581 | 4/1987 | European Pat. Off. |

OTHER PUBLICATIONS

Franchak et al., "Process Improvement for Fine—Line Metallized Ceramics", IBM Technical Disclosure Bulletin, vol. 24, No. 6, 11/81.

Cook et al., "Flash Etch Technique for Polyimide Insulated Double Metal Contact," IBM Tech. Disclosure Bulletin, vol. 20, No. 2, Jul. 1977, pp/525-526.

Geldermans et al., "Method for Making Tapered Via Holes in Polyimide Films by Plasma Ashing", IBM Technical Disclosure Bulletin, vol. 26, No. 4, 9/83.

IBM Technical Disclosure Bulletin, vol. 27, No. 11, Apr. 1985, "Resist Process For Improved Photo Throughput Of Small Etched Via Holes".

European Search Report Dated Aug. 3, 1988.

*Primary Examiner*—David L. Lacey
*Assistant Examiner*—Thi Dang
*Attorney, Agent, or Firm*—David L. Adour; Max Kenemore; Mark Levy

[57] ABSTRACT

Sloped vias are formed in a resinous layer made from a material which is curable in stages, which can be coated on a substrate prior to partial curing, which adheres to the substrate and which shrinks upon full curing by a process which includes first using a dry, directional etch to form straight walled vias in a partially cured layer of the material coated on the substrate and then fully curing the layer. The straight walled vias are changed to sloped vias during final cure when adhesive contact between the substrate and the layer of resinous material inhibits shrinking of the side of the resinous layer which contacts the substrate, while the unsupported side of the layer is free to shrink. Such sloped vias are observed to improve the integrity of conductive coatings placed in the vias by reducing cracking, peeling and flaking thereof. Sloped vias with conductive coatings are useful in the construction of computer components.

6 Claims, 2 Drawing Sheets

METHOD OF MAKING SLOPED VIAS

FIELD OF THE INVENTION

This invention relates generally to the fabrication of vias in electrically insulating resinous layers and, more particularly, to a novel method for making sloped vias in such layers.

BACKGROUND OF THE INVENTION

Insulating layers are commonly used to separate conductors or semi-conductors in the manufacture of computer components. Such layers are used in the construction of both computer chips and packages for carrying the chips.

Most such insulating layers have holes or vias made in them. The walls of the vias are often plated with a conductor, such as copper, to provide electrical communication between conductive or semi-conductive materials on either side of the layer.

When straight walled vias are formed in the insulating layer by, e.g., drilling or directional plasma etching, a problem is often encountered with the integrity of the conductive material which is subsequently deposited on the via walls. The conductive material is sometimes observed to crack and then to peel or to flake away from the sharp corners where the straight walls of the vias meet the planar surface of the insulating layer.

Considerable effort has gone into efforts to overcome this problem. Sloped vias which avoid the sharp corners where the via walls meet the surface of the resinous layer have been generally accepted as a useful solution to the problem. However, an optimum method for making sloped vias in resinous layers, especially in the dry or plasma manufacturing of computer components has, until now, not been found.

U.S. Pat. No. 4,369,090 to Wilson et al describes a method of fabricating a cured polyamic acid film with sloped vias. The Wilson et al method includes the partial curing of a polyamic acid film at a certain critical chronostatic temperature prior to wet chemical etching of vias in order to achieve a controlled slope of the via wall. The desired tapering effect of Wilson et al is obtained due to the nature of the partial curing or imidization step.

U.S. Pat. No. 4,411,735 to Belani indicates that in the wet etching of vias the slope of the via wall can be controlled between 45 and 90 degrees by the selection of etchants.

U.S. Pat. No. 4,482,427 to Hiraoka describes a dry process for forming via holes with sloped walls in a polymer layer by oxygen reactive ion etching through a perforated mask. Hiraoka accomplishes the sloped vias by positioning the mask a critical distance above the polymer layer.

U.S. Pat. No. 4,487,652 to Almgren describes the transfer of the slope in the walls of a mask aperture to the walls of an underlying polyimide via by careful control of a plasma with respect to the predetermined etching selectivity of the mask material and the polyimide.

U.S. Pat. No. 4,495,220 to Wolf et al shows the use of a phosphorous doped silicon dioxide mask to form sloped vias in an underlying polyimide layer. Oxygen plasma etches polyimide exposed through openings in the silicon dioxide mask and also etches polyimide under the mask around the openings. Bowl shaped voids are formed in the polyimide under the openings and extending around the openings. The doped silicon dioxide mask is removed to expose the sloped vias.

U.S. Pat. No. 4,354,897 to Nakajima shows a method of forming a sloped via in an insulating layer which includes the step of wet chemical etching through a photoresist mask in such a way that the wet etching undercuts the photoresist mask, softening the mask so that it slopes into the undercut cavity and, thereafter, dry etching the bottom of the cavity.

SUMMARY OF THE INVENTION

It is an object of the present invention to provide an improved method for making sloped vias in resinous layers.

It is also an object of the present invention to avoid loss of electrical integrity in conductively plated vias in resinous insulators.

It is still another object of the present invention to provide structures containing resinous insulating layers with sloped vias which are useful in the manufacture of computer components.

These and other objects are accomplished by the present invention which relates to a novel method for making sloped vias in a resinous layer supported on a substrate. The method comprises the steps of: (a) providing a partially cured resinous layer adhesively supported on a substrate which is dimensionally stable at the curing temperature of the resinous layer; (b) forming straight-walled vias in the resinous layer; and (c) fully curing the resinous layer. Shrinking of the supported surface of the resin during (c) is inhibited by adhesion between the substrate and the supported surface, causing the walls of the vias to take on a sloped cross-sectional profile.

In subsequent steps the vias may be coated with a conductive or semi-conductive material which, in turn, may be over coated with other layers of material.

BRIEF DESCRIPTION OF THE DRAWINGS

The invention is illustrated below with reference to the drawings which are intended to be exemplary and not exhaustive.

DESCRIPTION

It has been discovered that sloped vias can be formed in a resinous layer made from a material which is curable in stages, which can be coated on a substrate prior to partial curing, which adheres to the substrate and which shrinks upon full curing by a process which includes first using a dry, directional etch to form straight walled vias in a partially cured layer of such material coated on a substrate and then fully curing the layer. The straight walled vias are changed to sloped vias during final cure when adhesive contact between the substrate and the layer of resinous material inhibits shrinking of the side of the resinous layer which contacts the substrate, while the unsupported side of the layer is free to shrink.

Figure 1:
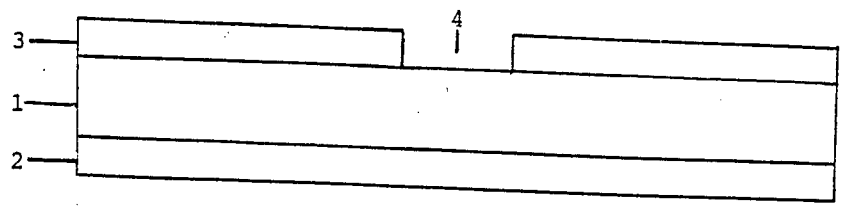
FIG. 1 shows a resinous layer supported on a substrat and masked on its unsupported side.

Referring more specifically to FIG. 1, there is shown resinous layer 1 supported on substrate 2. Resinous layer 1 is coated with mask layer 3.

Substrate 2 may be any suitable material. Typically substrate 2 is formed from a ceramic material, a conductor such as copper or a semi-conductor such as silicon. Substrate 2 may also be formed from a combination of such materials. For example, the substrate may be a ceramic material which has been over coated with a conductor or semi-conductor.

Resinous layer 1 is partially cured after being deposited on substrate 2. In order to be useful in the present invention, the resinous material must have certain characteristics. It must be able to be first partially cured and then later to be fully cured. It must be electrically insulating when fully cured. It must exhibit some adhesion to the substrate, and it must shrink upon final curing.

Any resinous material having these characteristics will be useful in the present invention. Typical of such materials are polyamic acids and epoxies.

The particular method of applying the resinous layer is not critical to the operation of the invention, and any useful method may be used. Spin coating of a film of uncured material which is subsequently partially cured is an example of a useful method of coating substrate 2 with partially cured resinous layer 1.

Good results will be obtained by coating a mixture of pyromellitic dianhydride and oxydianiline on a copper-coated ceramic substrate and curing at 80° to 100° C. for 10 minutes. The resulting partially cured resin is observed to adhere to substrate 2 when so coated. Some adherence between resinous layer 1 and substrate 2 is critical to the operation of the invention. Strong adherence, however, is not necessary. The adherence need be only sufficiently strong that substrate 2 and resinous layer 1 will not separate during subsequent full curing of resinous layer 1.

It is preferred to coat uncured resinous layer 1 onto substrate 2 at a thickness which will result in a fully cured layer of not less than about 2 microns. Experimental evidence will show that the integrity of fully cured resinous layers of less than about 2 microns will not be sufficiently predictable to be used in the manufacture of computer components.

When epoxies and polyamic acid resinous materials are used to form resinous layer 1, good results will be obtained when the partially cured resin has a thickness of from about 5 to about 40 microns. Such resins will be observed to lose about half their volume upon full curing to provide fully cured layers 1 of from about 2.5 to about 20 microns.

Mask layer 3 may be formed from any material which will protect the masked portion of resinous layer 1 from the etching effect of a plasma. Good results have been obtained using both photoresist materials and metal masks.

The mask shown in FIG. 1 is a photoresist material. It can be applied to resinous layer 1 by any of the well known means for coating photoresist on carrier layers. The method of applying the photoresist is not critical to the present invention. One such photoresist material which will be found to be useful in the present invention is Waycoat which is commercially available from Hunt Chemicals.

The photoresist layer is imagewise exposed and developed by well known processes and techniques to form mask layer 3.

A part of the photoresist layer is removed by the exposure and development process to form openings such as opening 4 as is shown in FIG. 1. The developed photoresist layer then functions as a mask layer for subsequent directional plasma etching of resinous layer 1.

Figure 2:
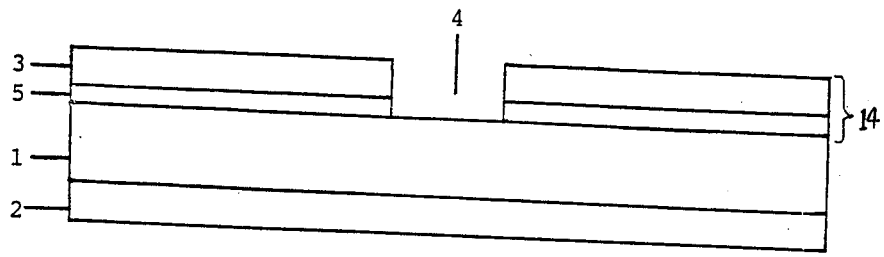
FIG. 2 shows an alternative mask.

FIG. 2 shows an alternative mask 14 which is made up of photoresist 3 and metal layer 5. Mask 14 of FIG. 2 may be formed by an already well known process which includes a first step of depositing a metal layer, such as copper, on the polyimide surface. The metal may be deposited by, for example, sputtering or evaporation.

A photoresist layer is deposited over the metal. It is exposed to an imagewise pattern of light and developed to expose portions of the metal layer. The exposed portions of the metal layer are etched away by a suitable etchant, while the portions of the metal layer protected by the photoresist are not etched.

After etching, the structure of FIG. 2 is obtained.

This method of forming useful masks will be easily thought of by those of ordinary skill in the art of etching printed circuits. For example, a metal mask can be deposited on layer 1 by evaporating the metal through a mask.

Figure 3:
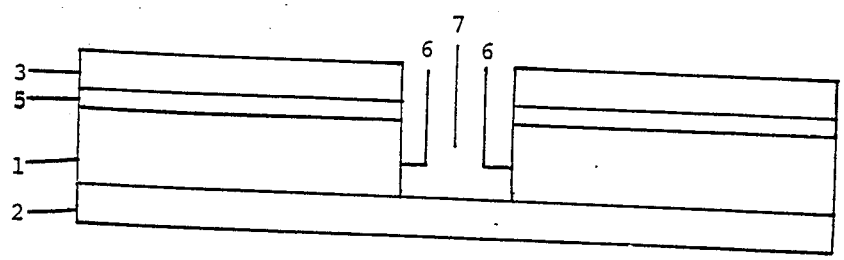
FIG. 3 shows the structure of FIGS. 1 or 2 after directional etching of the resinous layer.

Whether the mask of FIG. 1 or FIG. 2 is used, resinous layer 1 is subjected to directional dry etching to form vias 7 with straight walls 6 as are shown in FIG. 3. The metal-layer-containing mask of FIG. 2 is preferred in the process of the present invention because the metal layer will protect the underlying resin from most forms of dry etching, giving the technician more freedom to select from a variety of etching systems.

Good results will be obtained with the use of directional reactive ion etching, although laser etching may also be used with success. When reactive ion etching is used in connection with mask embodiments such as that shown in FIGS. 1 or 2, etching is normally accomplished by the use of an oxygen/carbontetrafluoride plasma. When laser etching is is desired, an eximer laser will provide good results when used in combination with the mask shown in FIG. 2.

After vias 7 with straight walls 6 have been dry etched into resinous layer 1, the mask is removed. If the mask of FIG. 1 has been used, it is removed by any of the well known photoresist solvents such as, for example, J100 which is commercialyy available from IN-DUST-RI-CHEM Laboratory. The mask for FIG. 2 is removed by first dissolving any remaining photoresist material with an appropriate solvent and then taking off the metal layer with a solvent which will not effect the resinous layer, such as ferric chloride.

Figure 4:
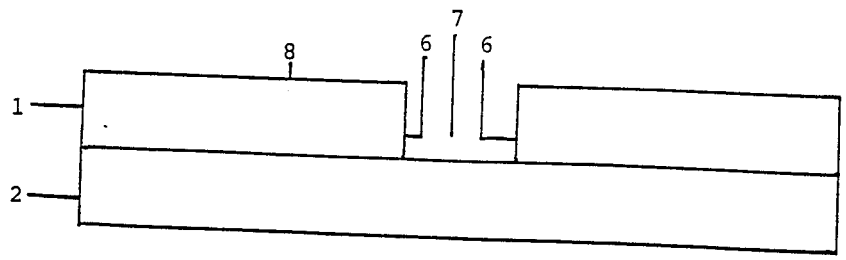
FIG. 4 shows the structure of FIG. 3 after removal of the mask.

The structure shown in FIG. 4 results when the mask has been removed. Resinous layer 1 contains via 7 with straight walls 6 which communicate between substrate 2 and the unsupported surface 8 of resinous layer 1.

Figure 5:
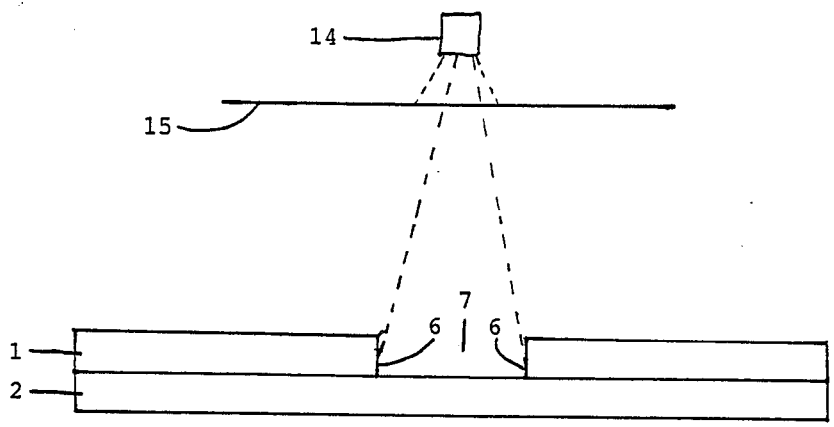
FIG. 5 shows an alternative method of directionally etching a resinous layer using a laser.

FIG. 5 shows yet another suitable method for forming via 7 in resinous layer 1 on substrate 2 such that the walls 6 of via 7 are straight. Layer 1 is subjected to the effects of scanning laser 14 which scans layer 1 through mask 15. Mask 15 is held out of contact with layer 1 in this method.

The structure of FIGS. 4 or 5 is then treated to a final cure. Typically such a final cure is to 360 degrees C. for approximately 1 hour.

Resinous layer 1 shrinks in thickness during the final curing stage. Layer 1 also attempts to shrink horizontally; however, the adhesive attraction between substrate 2 and layer 1 prevents layer 1 from shrinking horizontally at the interface between them. Shrinking of the unsupported surface of layer 1 is not impeded, and that surface shrinks horizontally.

Figure 6:
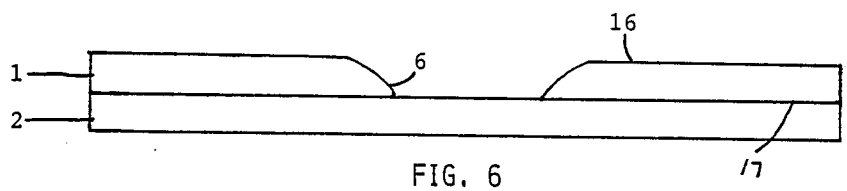
FIG. 6 shows the resinous layer with vias having sloped walls.
Figure 7:
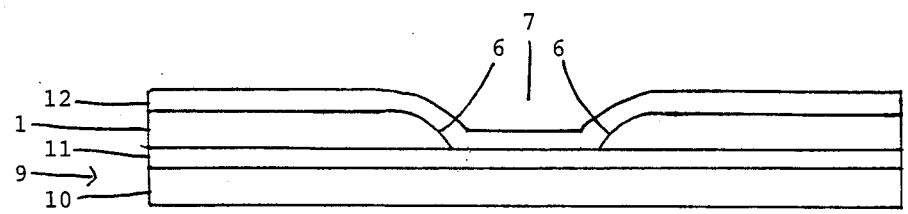
FIGS. 7 and 8 show the structure of FIG. 6 after additional layers have been added.

The horizontal shrinking of unsupported surface 16 of layer 1 and the inability to shrink of the supported surface 17 results in the structure of FIG. 6 in which via walls 6 have been convex sloped FIG. 7 shows a structure made by the process of the present invention wherein substrate 9 is made up of ceramic layer 10 which has been over coated with conductor layer 11. Insulating layer 1 includes via 7 with sloped walls 6. The unsupported surface of layer 1 has been coated with a conductor which extends onto the sloped walls 6 and layer 11 at the bottom of via 7. The conductor material 12 on sloped via walls 6 provides electrical communication between the top of insulator layer 1 and conductor layer 11. Such communication is well known to be useful in the construction of chips and packages used in computers.

The placing of conductive layers on insulating materials is already well known. For example, conductive layers 11 and 12 can be deposited on ceramic substrate 10 or insulating layer 1 by sputtering, vacuum deposition or additive plating.

It will be readily apparent to those of ordinary skill in the art of making computer components that layers 11 and 12 could be made from semi-conductive materials as well as conductive materials. Typical semi-conductive materials are, for example, silicon, selenium and gallium arsenide.

Structures such as that shown in FIG. 7 wherein sloped walls 6 of via 7 have been made by the process of the present invention and a copper layer 12 has been coated onto polyimide layer 1 have been examined for cracking, peeling or flaking of copper after being subjected to flexure and handling typical of that experienced by computer chips and by printed circuit boards. Substantially no peeling or flaking of copper was observed.

Figure 8:
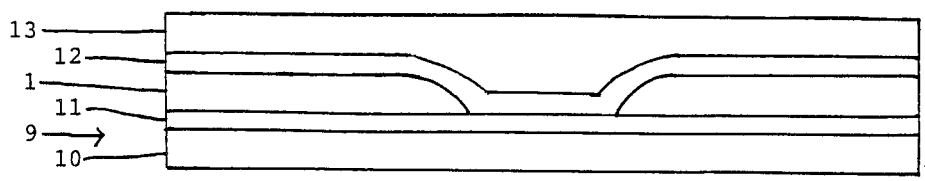

FIG. 8 shows a structure which may be made by adding yet a further layer to the structure of FIG. 7. Insulating layer 13 is coated onto the structure of FIG. 6 to result in the encapsulation of conductive layers 11 and 12. One of ordinary skill in the art of making computer components will readily understand that any number of additional layers may be added to the structure and that any suitable resinous material can have sloped wall vias made by the process of the present invention in any number.

The foregoing and other objects, features and advantages of the invention will be apparent from the following more particular description of preferred embodiments of the invention, as illustrated in the accompanying drawings.

While the invention has been particularly shown and described with reference to preferred embodiments thereof, it will be understood by those skilled in the art that various change in form and details may be made therein without departing from the spirit and scope of the invention.

What is claimed is:

1. A method for making sloped vias in a resinous layer supported on a substrate formed from a material selected from the group consisting of conductors, semiconductors, ceramics and ceramics coated with conductors or semi-conductors, the method comprising:
   (a) providing a partially cured electrically insulating resinous layer having a thickness of about 5 to about 40 microns which will shrink upon full curing adhesively supported on a substrate which is dimensionally stable at the curing temperature of the resinous layer;
   (b) forming straight-walled vias in the resinous layer by dry directional etching; and
   (c) fully curing the resinous layer to shrink the unsupported surface of the resinous layer, whereby shrinking of the supported surface of the resinous layer during step (c) is inhibited by adhesion between the substrate and the supported surface, causing the walls of the vias to take on a sloped cross-sectional profile.

2. The method of claim 1 wherein said directional etching is accomplished by reactive ion etching or by laser etching.

3. The method of claim 1 wherein step (b) comprises etching through a temporary mask placed on the unsupported surface of the resinous layer.

4. The method of claim 3 wherein the mask is a photoresist.

5. The method of claim 3 wherein the mask includes a conductive layer and a photoresist, the conductive layer being placed between the photoresist and the resinous layer.

6. The method of claim 1 wherein the straight-walled vias are formed by laser etching through a mask which is not in contact with the resinous layer.

* * * * *